United States Patent [19]

Allen et al.

[11] 4,034,291
[45] July 5, 1977

[54] ELECTRONIC MEASURING INSTRUMENT COMBINING AN OSCILLOSCOPE AND A DIGITAL MULTIMETER

[75] Inventors: David William Allen, Beaverton; Marshall Bond Borchert, Aloha, both of Oreg.

[73] Assignee: Tektronix, Inc., Beaverton, Oreg.

[22] Filed: Apr. 14, 1975

[21] Appl. No.: 567,798

[52] U.S. Cl. .............................. 324/121 R; 324/115
[51] Int. Cl.² .................. G01R 13/20; G01R 15/08
[58] Field of Search ............. 324/121 R, 99 D, 112, 324/115, 157; 325/367

[56] References Cited
UNITED STATES PATENTS 3,816,815  6/1974  Schumann .................... 324/112

OTHER PUBLICATIONS

Electronics; Jan. 10, 1974; p. 206.
Electronics, Jan. 9, 1975; p. 133.
Electronics; Apr. 3, 1975; pp. 28–29.
Tektronix Catalog; Tektronix, Inc., Beaverton, Ore.; 1971; pp. 217, 218, 222, 223, 235.

Primary Examiner—Rudolph V. Rolinec
Assistant Examiner—Ernest F. Karlsen
Attorney, Agent, or Firm—George T. Noe

[57] ABSTRACT

An oscilloscope and a digital multimeter are combined in a single housing to provide a portable electronic measurement instrument wherein a substantial portion of circuitry is common to both measurement systems. A cathode-ray tube provides the display for both waveform and alpha-numeric information.

8 Claims, 5 Drawing Figures

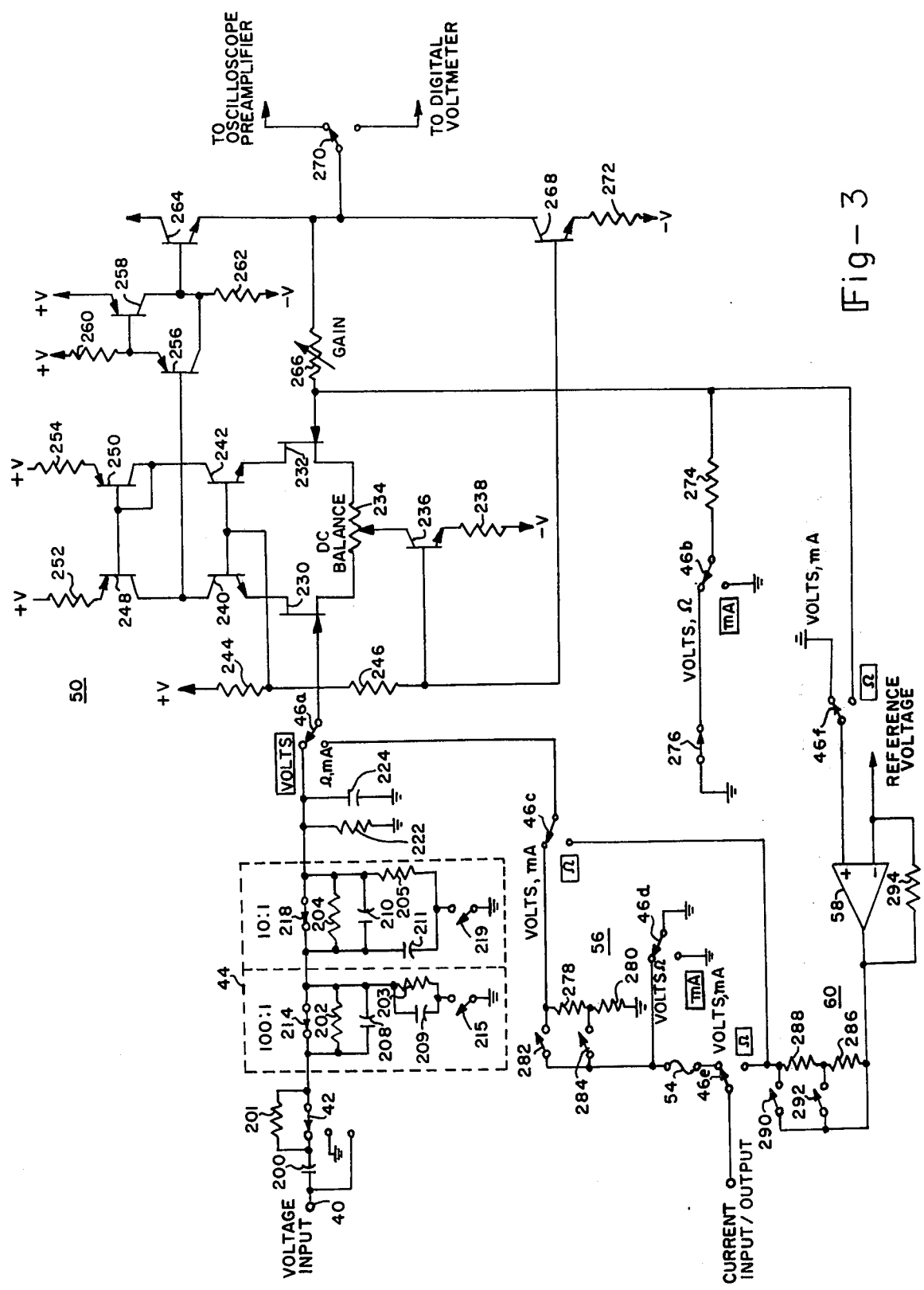

ELECTRONIC MEASURING INSTRUMENT COMBINING AN OSCILLOSCOPE AND A DIGITAL MULTIMETER

BACKGROUND OF THE INVENTION

In servicing electronic equipment of all kinds, two primary diagnostic tools are indispensable: the oscilloscope for observing the waveforms of electronic circuits under dynamic conditions and the multimeter for checking voltages, currents, resistances, et cetera, throughout the circuitry. Miniature solid-state oscilloscopes are now available, providing both versatility and portability. Miniature multimeters are also available which utilize digital processing means to provide extremely accurate measurement readings.

In one attempt to marry the digital multimeter with the oscilloscope, a multimeter plug-in module was designed for use with a sophisticated laboratory oscilloscope having extremely limited portability. Such laboratory oscilloscopes generally have at least two plug-in compartments for the vertical channels, and an additional plug-in compartment to accept a time-base plug-in module. Because of the nature of such oscilloscopes, circuitry must be separated into various plug-in modules, resulting in duplication of many circuits.

SUMMARY OF THE INVENTION

According to the present invention, a miniature oscilloscope and a digital multimeter are combined within a single housing in such a way that the analog system of the oscilloscope and digital system of the multimeter share much of the circuitry, and front-panel switches selected the desired operating mode and establish the signal routing where required.

In the preferred embodiment of the present invention, two inputs are provided for four basic operating modes. The oscilloscope vertical input and voltmeter functions share a first input including signal pre-processing circuits which include input coupling and attenuators, and the ammeter and ohmmeter functions share a second input including separated scaling resistors and current shunt resistors which are switched in and out of the circuit path according to the function and range chosen. An input buffer amplifier receives all of the preprocessed signals from both inputs and provides the first amplification thereof.

The output of the input buffer amplifier is routed to either a conventional oscilloscope vertical preamplifier or to the multimeter digital circuits, depending on the function chosen. The oscilloscope mode includes a conventional time-base generator to produce time-base sweep signals. The digital circuits include conventional Gm, RMS, and analog-to-digital converters, and additionally, a character generator to produce alphanumeric cathode-ray tube displays.

The oscilloscope and multimeter modes then share common vertical, horizontal, and z-axis final amplifiers which operate in accordance with information applied thereto to produce a cathode-ray tube display of either oscilloscope waveforms or digital readouts.

The instrument includes a self-contained battery-operable power supply to facilitate portability.

It is therefore one object of the present invention to provide an electronic measuring instrument of increased versatility and precision.

It is another object of the present invention to provide an electronic instrument including an oscilloscope and a digital multimeter within a single housing.

It is a further object of the present invention to provide an electronic instrument combining an analog system and a digital system wherein both systems share common circuitry.

It is yet another object of the present invention to provide a portable electronic measuring instrument of expanded capability.

Other objects and attainments of the present invention will become apparent to those skilled in the art upon a reading of the following detailed description when taken in conjunction with the drawings in which there is shown and described a block diagram and an illustrative embodiment of the invention; it is to be understood, however, that this embodiment is not intended to be exhaustive nor limiting of the invention but is given for purposes of illustration in order that others skilled in the art may fully understand the invention and principles thereof and the manner of applying it in practical use so that they modify it in various forms, each as may be best suited to the conditions of the particular use.

DRAWINGS

FIG. 3 shows a schematic of the input buffer amplifier utilized in the preferred embodiment.

DETAILED DESCRIPTION OF THE INVENTION

Figure 1:
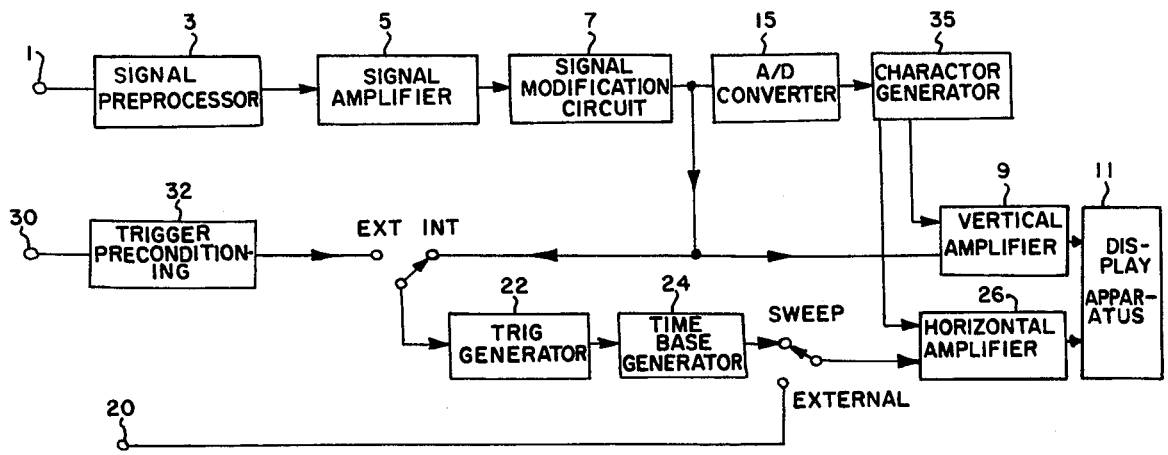
FIG. 1 shows a general block diagram of an electronic measuring instrument according to the present invention.

Turning now to the drawings, FIG. 1 shows a basic block diagram of the present invention in which an input terminal 1 accepts electrical signals which may be either voltage or current in a frequency range from DC to several megahertz. The signal is then acted upon by a signal prepossesor 3, which may include, for example, a voltage attenuator, a resistance-to-voltage converter, a current sampling resistor, and a frequency-to-voltage converter, etc., each of which may be operator selectable to be switched into the signal path according to the signal being measured, to produce a voltage signal therefrom which is suitable for amplification and further processing. The pre-processor 3 may also provide suitable scaling of the input signal.

The pre-processed voltage signal is then applied to a signal amplifier 5, which serves in a conventional manner to provide signal amplification and impedance matching between the pre-processing circuits and circuits which follow. The amplified signal is then applied to a signal modification circuit 7, which may include, for example, a root-mean-square (RMS) converter, a logarithmic amplifier, a noise filter, and a bandwidth filter, etc., each of which may be operator selectable to be switched into the signal path according to the function desired.

The modified signal, which is in analog form, may be applied directly to vertical amplifier 9 for display by display apparatus 11, or may be converted to digital form by analog-to-digital converter 15. Vertical amplifier 9 includes conventional amplifier circuits, and display apparatus 11 may suitably be a conventional cathode-ray tube. The analog modified signal may be displayed against a time-base sweep in a conventional oscilloscope mode of operation, or may be displayed against an external signal applied to terminal 20. A conventional trigger generator 22 is responsive to either the analog modified signal or an externally applied signal to produce a triggering signal to initiate a time-base sweep in time base generator 24. A conventional horizontal amplifier 26 then receives either the sweep signal or the externally-applied signal and provides an amplified signal thereof suitable to operate the display apparatus 11.

The time base circuits may be externally triggered by application of a triggering signal to terminal 30. Trigger preconditioning circuit 32, which may include bandwidth filters, amplitude rejection discriminators, digital gating, etc., preconditions the external triggering signal prior to application to trigger generator 22.

If an alpha-numeric display is desired rather than an analog or waveform display, character generator 35 generates character data in response to digital information from A-D converter 15. The character data is applied to vertical amplifier 9 and horizontal amplifier 26 for display by apparatus 11.

Figure 2A:
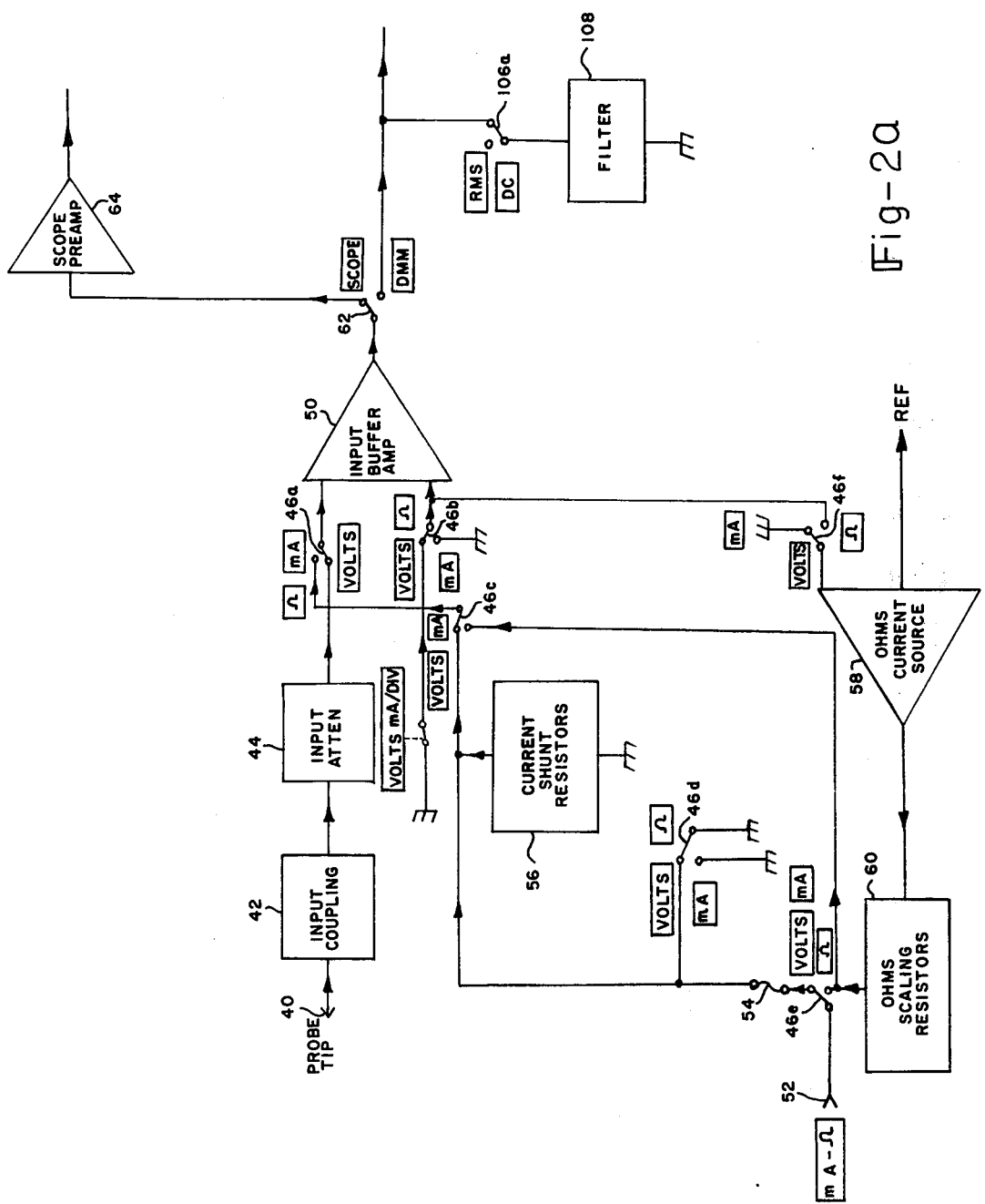
FIGS. 2a and 2b show a detailed block diagram of the preferred embodiment according to the present invention.
Figure 2B:
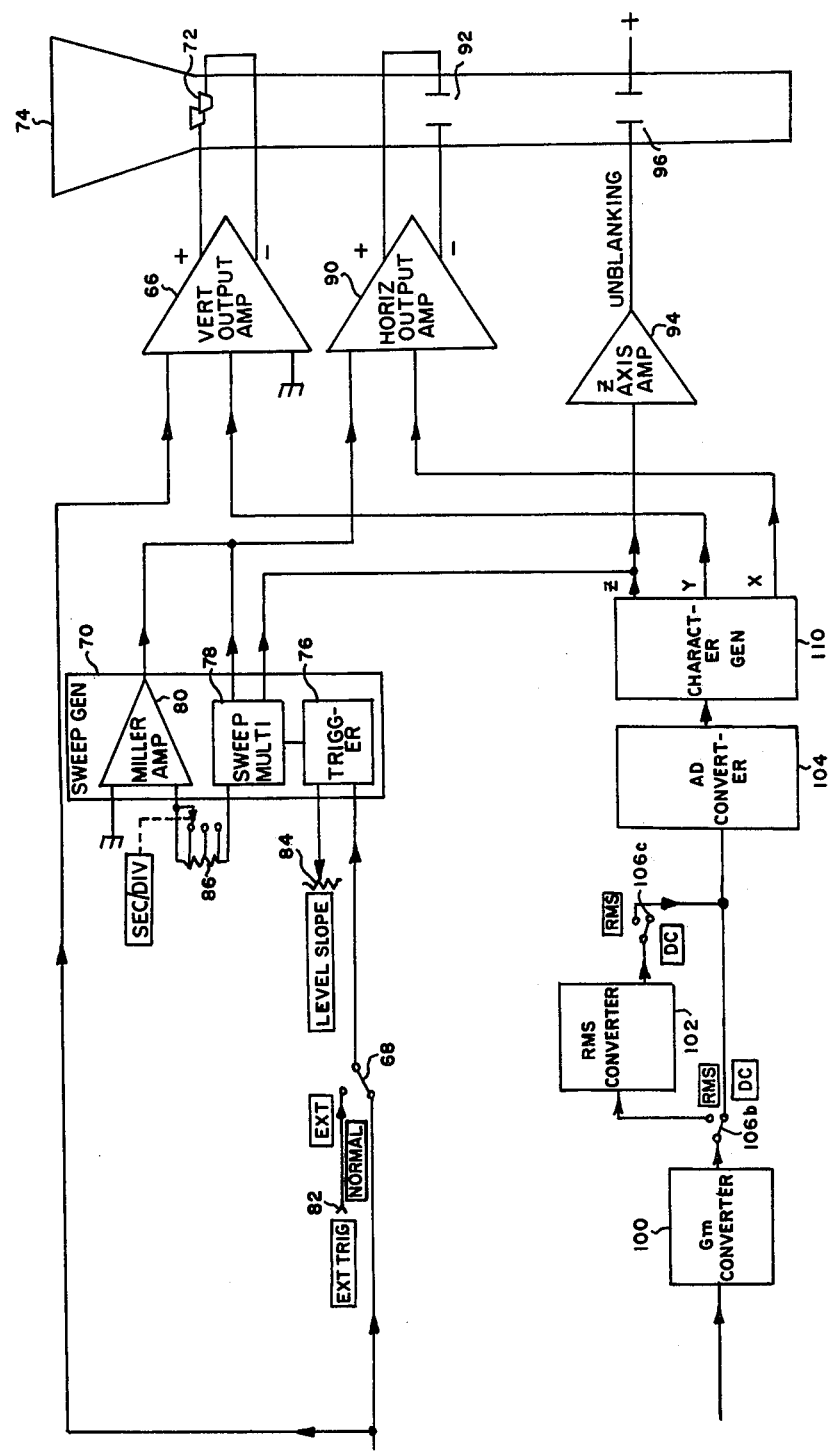

FIG. 2 shows a detailed block of the preferred embodiment of the present invention, wherein an oscilloscope and a digital multimeter are combined in a single unit. Voltage and analog waveforms may be applied to terminal 40 which is preferably a probe tip, but may be merely a signal connector to which any suitable lead may be connected. The voltage and analog waveforms are applied via input coupling 42, attenuators 44, and mode switch 46a to an input buffer amplifier 50. Input coupling 42 includes the conventional and well-known means for providing AC coupling, DC coupling, or a grounded input. Attenuators 44 are conventional frequency-compensated voltage dividers which provide both selectable attenuation ratios, for example, 1:1, 10:1, 100:1, etc., and selectable input resistances, for example, 1 megohm for oscilloscope operation and 10 megohms for digital voltmeter operation. Mode switch 46 may be in the form of self-cancelling pushbutton switches to select the volts, milliamperes, and ohms measurement functions. Since an oscilloscope waveform may typically be an analog voltage or current, the volts and mA functions may be utilized for oscilloscope operation as well as digital voltmeter operation.

Terminal 52, which may suitably be a banana jack, provides an input connection for measuring electrical current and resistance. With mode switches 46 set to the milliamperes (mA) position, input current flows through switch 46e and optional fuse 54 to the current shunt resistors 56, through which the current flows to ground, developing a voltage thereacross which is applied to the input of buffer amplifier 50. The inputs of buffer amplifier 50 are preferably field-effect transistors, the gates of which represent a high impedance to input signals so that essentially all of the input current flows through the current shunt resistors 56. Current shunt resistors 56 may be selectable to provide the appropriate scaling for different current ranges.

In the ohms position of mode switches 46, ohms current source 58 produces a predetermined level of current which flows through ohms scaling resistors 60, the closed contact of mode switch 46e, and out through terminal 52 to a resistive load whose resistance is being measured, across which a voltage is developed and applied to the input of buffer amplifier 50.

The output of buffer amplifier 50 may be applied to either conventional oscilloscope circuitry or conventional digital multimeter circuitry depending upon the setting of switch 62. In the oscilloscope position of switch 62, the signal is applied to preamplifier 64, which may be a conventional feedback amplifier including gain switching, vertical positioning, etc. In conventional oscilloscope fashion, the preamplifier 64 output is applied to a vertical output amplifier 66, and is simultaneously available via switch 68 to trigger the sweep generator 70. Vertical amplifier 66 splits the vertical signal into a push-pull signal suitable to drive the vertical deflection plates 72 of cathode-ray tube (CRT) 64.

The sweep generator 70 typically includes a trigger generator portion 76, a sweep multivibrator portion 78, and a Miller integrator portion 80. The trigger generator portion 76 generates a sweep trigger in response to triggering signals applied via switch 68 from the preamplifier 64 or an external triggering terminal 82. A Level/Slope control 84 establishes the point on the triggering signal at which the sweep trigger is generated. The sweep multivibrator portion 78 receives the sweep trigger and generates a sweep gate in response thereto. During the sweep gate, a constant current flows through selectable timing resistors 86 into the timing capacitor portion of the Miller integrator 80, producing at the output of the Miller integrator 80 a linear sawtooth voltage, which is split into a push-push sweep driving signal by a horizontal output amplifier 90 and applied to the horizontal deflection plates 92. The sweep gate is also applied to a z-axis amplifier 94 to neutralize unblanking plates 96 to allow the CRT electron beam to pass through, thereby "unblanking" the CRT. When the sweep gate terminates, the output of the z-axis amplifier 94 changes states, preventing the electron beam from passing through the plates 96, thereby "blanking" the CRT.

The digital multimeter circuits include a Gm converter 100, an RMS converter 102, and an A/D converter 104. The Gm converter 100 and RMS converter 102 may suitably be of the type described in U.S. Pat. No. 3,840,813. When the switch 62 is set to the digital multimeter position, the output of buffer amplifier 50 is applied to the Gm converter 100. The Gm converter 100 generates an output that is proportional to the absolute value of the input voltage, and for AC signals converts the bipolar input voltage to a unipolar output current.

Switch 106 provides a selection of DC measurement or RMS measurement. In the DC mode of operation, switch 106a is connected to filter 108 to remove the AC component of the input signal before it enters the Gm converter 100. Filter 108 may suitably be an operational amplifier configured as a low-pass two-pole active filter. Switch 106b connects the Gm converter output directly to A-D converter 104, which may be of the conventional "dual-slope" integration type.

In the RMS mode of operation, filter 108 is disconnected, and the output of the Gm converter is applied to the RMS converter 102. The RMS converter 102 accepts the absolute value current input from the Gm converter and changes it to a DC current which is proportional to the true RMS value. The DC current is then applied via switch 106c to the A-D converter 104, which produces a BCD output corresponding to the level of DC input current.

Character generator 110 receives the serial BCD data from A-D converter 104, and generates digital display character information which is applied to vertical amplifier 66, horizontal amplifier 90, and z-axis amplifier 94 to be read out on the screen of CRT 74. Character generator 110 for this embodiment is of the type which generates X and Y signals to produce seven straightline segments which arranged on the display screen of the cathode-ray tube to form the character 8. To form each of the display characters 0 through 9, character generator 110 is responsive to the serial BCD data to produce z-axis blanking signals corresponding thereto so that one or more of the seven segments of the 8 are blanked out to form the other characters.

The digital multimeter portion may also include circuits for polarity sign control, decimal point location, and overrange indication; however, these are standard techniques and well known to those skilled in the art and are therefore not shown in the drawings in the interest of simplicity.

Turning now to FIG. 3 of the drawings, the input circuits according to the preferred embodiment of the present invention are shown. Circuit elements which are similar to those shown in FIG. 2 utilize the same reference numerals to facilitate cross-reference between the drawings and to provide a clear understanding of the invention. Input voltages, which may be DC or time-varying over a wide range of frequencies from DC to several megahertz, are applied to input terminal 40. Switch 42 permits AC or DC coupling to the amplifier input, as well as grounding the amplifier input if this is desired. For AC coupling, capacitor 200 is placed in the input path. Resistor 201, which is shunted around switch 42, is utilized in the grounded position of switch 42 to permit capacitor 200 to pre-charge to the source voltage prior to selection of AC coupling so that the amplifier input does not experience a current surge when connected to a voltage source. The attenuator section 44 provides 1:1, 10:1, 100:1, or 1000:1 attenuation of the input signal. The attenuators are conventional frequency-compensated voltage dividers comprising resistors 202-205 and capacitors 208-211. Switches 214 and 215 are ganged together so that both are not opened or closed at the same time. With switch 214 closed, the 100:1 attenuator section is bypassed. When switch 214 is opened, switch 215 is closed and the 100:1 attenuator section is activated. In a similar manner, switches 218 and 219 function for the 10:1 attenuator section.

Resistor 222 and capacitor 224 provide a predetermined input impedance, for example, 10 megohms paralleled by 100 to 150 picofarads. The resistors and capacitors of the attenuator 44 are selected to maintain this impedance value throughout the attenuator range to ensure the predetermined value.

The function selector 46 is preferably a set of three self-cancelling pushbutton switches as described previously. The function which is selectable by any one of the three pushbuttons is shown in the diagram with a box drawn around that particular function; the other two functions are shown in the other switch position. As shown in FIG. 3, switch 46 is in the VOLTS position.

The input buffer amplifier 50 includes a pair of differentially coupled field-effect transistors (FET's) 230 and 232 whose sources are connected together through a resistor 234 and to the collector of a constant-current source transistor 236. Resistor 238 is connected between the emitter of transistor 236 and a negative supply voltage to establish the operating current for the FET's. Resistor 234 is adjustable to balance the current through the FET's. A pair of common-base transistors 240 and 242 are connected to the drains of FET's 230 and 232 respectively. Resistors 244 and 246 provide the biasing for transistors 236, 240, and 242. A pair of mirror-current transistors 248 and 250 are connected to the collectors of transistors 240 and 242 respectively; the emitters of these transistors are long-tailed through resistors 252 and 254 respectively to a positive voltage supply. A common emitter amplifier comprising transistors 256 and 258 connected in a Darlington configuration is connected to the collector of transistor 240. Resistor 260 provides biasing current for transistor 256. Connected to the collectors of transistors 256 and 258 is a collector load resistor 262 and an emitter follower transistor 264. The emitter of transistor 264 is connected through feedback resistor 266 to the gate of FET 232, as well as being connected to the collector of constant current source transistor 268 and to an output switch 270. Resistor 272 sets the current through transistor 268.

The gate of FET 232 is also connectable to ground through resistor 274, and switches 46b and switch 276. The gain of the input buffer amplifier is established by resistors 266 and 274. When the end of resistor 274 is grounded, the gain may be a predetermined value, for example, 10, depending on the ratio of resistance values of resistors 266 and 274. Resistor 266 may be adjustable to provide a variable gain. With the end of resistor 274 ungrounded, the amplifier gain is 1 because there is no current path for resistor 266 and thus no voltage drop thereacross. Switch 276 may be ganged with the attenuator switches 214, 215, 218, and 219 so that the gain of the input may be switched for predetermined attenuation values.

The input voltage signal is applied via switch 46a from the attenuator 44 to the gate of FET 230. The gate resistance of the FET is extremely high, consequently it can be said that no current flows into or out of the gate. The gate voltage controls the drain-to-source current of the properly biased FET by "pinching" the current channel therethrough. An in-phase voltage signal is developed at the collector of transistor 240 and applied to the base of transistor 256. Transistor 256 inverts the signal so that the output of buffer amplifier 50 is 180° out of phase with the input thereof.

To measure current or resistance, it can be seen that these quantities must be converted to a voltage in order to control the conduction of FET 230. This is achieved by placing resistors in the respective current paths to develop voltage thereacross.

With switch 46 set to the mA position, an input current at terminal 52 flows through switch 46e, fuse 54, switch 282, and the serially connected resistors 278 and 280. The voltage developed across these resistors is applied via switches 46c and 46a to the gate of FET 230. Proper scaling of the measured current may be effected by opening switch 282 and closing switch 284, so that only the voltage developed across resistor 280 is applied to the FET gate. While two serial resistors 278 and 280 are shown, it can be appreciated that the scaling may be extended by providing additional resistors and switches.

Resistance measurements are facilitated by placing the function switch 46 in the Ω position. In this mode of operation, resistor 286 and 288 serve the same purpose as resistors 278 and 280 described above, with switches 290 and 292 providing selection of the desired scaling. A constant voltage generator comprising operational amplifier 58 and feedback resistor 294 generates a precise voltage which is impressed across resistors 286 and 288, developing a predetermined amount of current to be delivered to the terminal 52, to which an unknown resistance is connected. The voltage developed across the unknown resistance by the predetermined current is applied via switches 46c and 46a to the gate of FET 230. Again, it can be appreciated that the scaling can be extended by providing additional serially-connected resistors in series with resistors 286 and 288.

Figure 4:
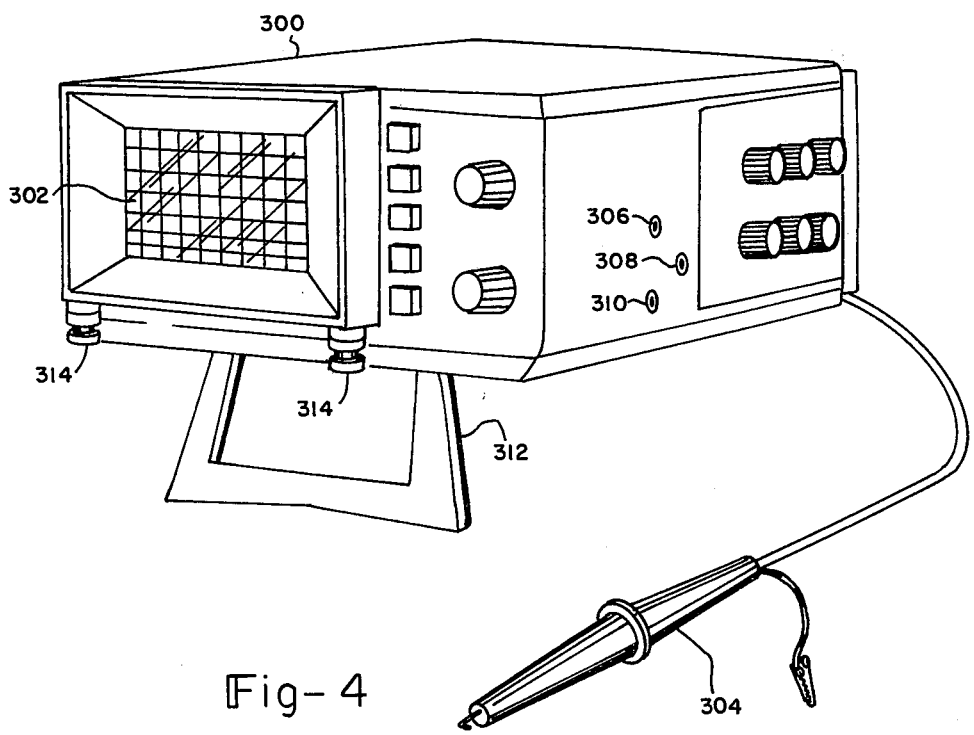
FIG. 4 shows an illustration of a portable miniature electronic measuring instrument including both an oscilloscope and a digital multimeter in accordance with the present invention.

FIG. 4 is illustrative of a portable miniature electronic measuring instrument including both an oscilloscope and a digital multimeter. A case 300 houses the electronic circuits described hereinabove, including a miniature cathode-ray tube. A display screen 302 may include a scribed graticule scale to facilitate waveform measurements. A voltage probe 304 may be an integral part of the instrument, wrapping around a spool-like cord wrap when not in use. Banana-jack terminals 306, 308, and 310 permit connection of current-related signals, instrument ground, and external triggering signal inputs respectively. A retractable bail-like stand 312 permits the front of the instrument to be raised when operated from a bench or the like, while a pair of studs 314 permit connection of a neck cord to free the operator's hands while using the instrument.

It can now be discerned from the foregoing description that the aforementioned and other objects have been achieved; however, it should be emphasized that the particular embodiment of the invention, which is shown and described herein, is intended as merely illustrative and not as restrictive of the invention.

What we claim as being new is:

1. A portable electronic measuring instrument, comprising:

input circuit means including preprocessing means for converting a plurality of input signals of different measurement quantities to voltage signals;

analog processing means for receiving said voltage signals and producing an analog waveform signal therefrom;

digital processing means for receiving said voltage signals and producing numerical values thereof, said digital processing means including a Gm conversion unit, an RMS conversion circuit, and an A-D converter; and display means for selectively displaying said analog waveforms and said numerical values.

2. The instrument according to claim 1 wherein said input circuit means includes at least one amplification stage for providing a buffer between said preprocessing means and said analog and digital processing means.

3. The instrument according to claim 1 wherein said prepossessing means includes means for scaling said input signals to within a predetermined amplitude range.

4. The instrument according to claim 1 wherein said digital processing means further includes an alpha-numeric character generator circuit.

5. A portable measuring instrument including an oscilloscope and a digital multimeter, comprising:

input circuit means for receiving voltage and current signals, said input circuit means including means for converting said current signals to voltage signals;

analog processing means including a vertical amplifier channel and a sweep generator connectable to said input circuit means for receiving said voltage signals and generating analog waveforms therefrom;

digital processing means including an A-D converter and an alpha-numeric character generator connectable to said input circuit means for receiving said voltage signals and generating characters corresponding to the numerical values thereof; and display means including a cathode-ray tube for selectively displaying said analog waveforms and said alpha-numeric characters.

6. The instrument according to claim 5 wherein said input means includes impedance elements and at least one amplification stage for determining the amplitude range of said instrument.

7. The instrument according to claim 5 wherein said input means includes current generator means for producing a predetermind output current to a resistance being measured.

8. The instrument according to claim 5 wherein said digital processing means further includes a Gm conversion circuit and an RMS conversion circuit.

* * * * *

UNITED STATES PATENT OFFICE
CERTIFICATE OF CORRECTION

Patent No. 4,034,291  Dated July 5, 1977

Inventor(s) David William Allen et al.

It is certified that error appears in the above-identified patent and that said Letters Patent are hereby corrected as shown below:

Column 8, line 13, "prepossessing" should read -- preprocessing --.

Signed and Sealed this

Twenty-eighth Day of February 1978

[SEAL]

Attest:

RUTH C. MASON  
Attesting Officer

LUTRELLE F. PARKER  
Acting Commissioner of Patents and Trademarks